US006490061B1

(12) United States Patent
Tanaka et al.

(10) Patent No.: US 6,490,061 B1
(45) Date of Patent: Dec. 3, 2002

(54) OPTICAL INFORMATION RECORDING AND REPRODUCING APPARATUS HAVING VOLUME HOLOGRAPHIC MEMORY

(75) Inventors: Satoru Tanaka, Tsurugashima (JP); Tomomitsu Kouno, Tsurugashima (JP); Hideki Hatano, Tsurugashima (JP); Yoshihisa Itoh, Tsurugashima (JP); Hajime Matsushita, Tsurugashima (JP); Takashi Yamaji, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/540,202

(22) Filed: Mar. 31, 2000

(30) Foreign Application Priority Data

Mar. 31, 1999 (JP) .......................................... 11-091749

(51) Int. Cl.$^7$ ................................................ G03H 1/26
(52) U.S. Cl. ...................... 359/22; 369/103; 369/124.07
(58) Field of Search ................................ 359/3, 4, 7, 5, 359/22, 24, 29, 35; 365/125, 189.02, 216, 234, 235; 369/103, 124.07, 275.2

(56) References Cited

U.S. PATENT DOCUMENTS

| | | | |
|---|---|---|---|
| 4,449,785 A | * 5/1984 | Huignard et al. | 350/3.61 |
| 5,648,856 A | * 7/1997 | Stoll | 359/3 |
| 5,698,344 A | * 12/1997 | Bai et al. | 430/1 |
| 5,777,760 A | * 7/1998 | Hays et al. | 359/7 |
| 5,844,700 A | * 12/1998 | Jeganathan et al. | 359/7 |
| 5,978,112 A | * 11/1999 | Psaltis et al. | 359/22 |

* cited by examiner

*Primary Examiner*—Cassandra Spyrou
*Assistant Examiner*—Alessandro V. Amari
(74) *Attorney, Agent, or Firm*—Crowell & Moring LLP

(57) ABSTRACT

A description is provided of an optical information recording and reproducing apparatus. The apparatus comprises: a holographic memory made of a photorefractive crystalline material; a support portion for detachably supporting the memory; a reference beam supplying portion for supplying a coherent reference beam of a first wavelength incident on the memory; a signal beam generating portion for supplying a coherent signal beam of the first wavelength, which is modulated in accordance with image data, incident on the memory, intersecting therein the signal beam with the reference beam, and generating a three-dimensional interference pattern of the beams; a detecting portion for detecting a diffracted light from a refractive index grating of the interference pattern in the memory, due to irradiation of the reference beam; and a medium position adjusting portion for moving a position of the support portion in accordance with a signal corresponding to positioning images from the detection portion. The memory includes a nonvolatile refractive index grating corresponding to a three-dimensional interference pattern of a coherent reference beam and a coherent signal beam, the coherent signal beam being modulated in accordance with positioning images.

2 Claims, 12 Drawing Sheets

DISPERSED CONFIGURATION

CONTINUOUS CONFIGURATION

CONCENTRICAL CONFIGURATION
(SQUARE)

CONCENTRICAL CONFIGURATION
(CIRCULAR)

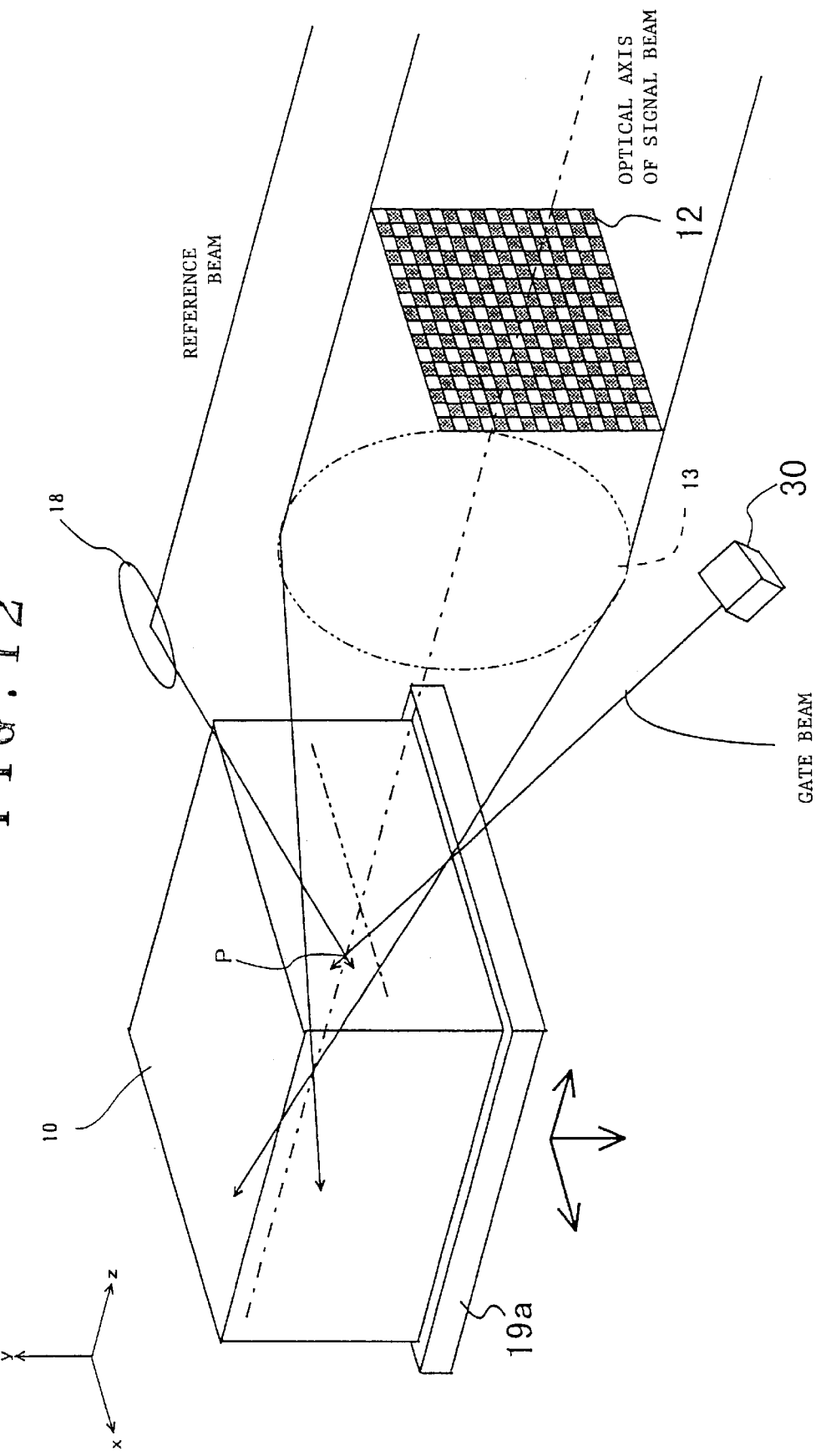

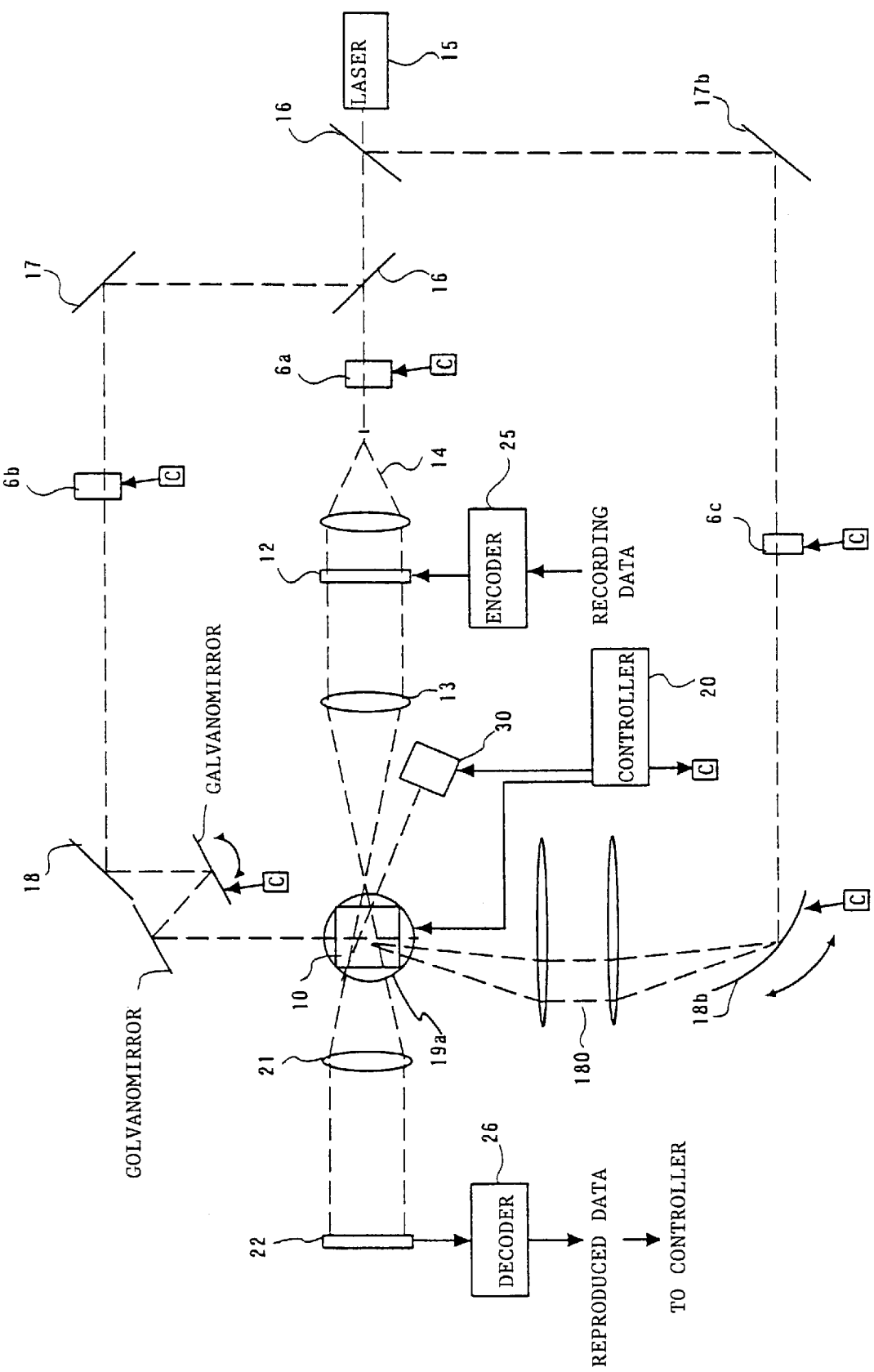

OPTICAL INFORMATION RECORDING AND REPRODUCING APPARATUS HAVING VOLUME HOLOGRAPHIC MEMORY

BACKGROUND OF THE INVENTION

1. Field of the Invention

The present invention relates to a holographic memory and an optical information recording and reproducing apparatus using the holographic memory.

2. Description of the Related Art

Conventionally, a holographic memory system is known as a digital recording system using the principle of holography. The holographic memory system records and reproduces digital data to/from a memory medium of a photorefractive crystalline material such as lithium niobate ($LiNbO_3$). The photorefractive effect is a phenomenon in which electric charges generated by photoexcitation move through crystals to thereby form a spatial electric field distribution, which couples with a primary electro-optical effect (i.e., Pockels effect) to change a refractive index of the crystals.

With regard to a ferro-electric crystal which exhibits the photorefractive effect, a refractive index change normally responds to an optical input pattern of 1000 or more lines per 1 mm, and the effect appears in real-time at a response speed of the order of micro-second to second, depending upon a material of the crystal. Therefore, such crystal has been studied as a real time hologram medium, which does not need developing, with respect to various applications.

The holographic memory system can record and reproduce data in a two-dimensional plane page unit, and perform multiple recording with the use of a plurality of pages. The volume holographic memory enables three-dimensional recording with the memory medium being of three-dimensional configuration such as a rectangular parallelepiped. The volume holographic memory is a kind of Fourier transform holograms. Data is recorded in a dispersed manner by unitary image pages in a three-dimensional space of the memory. An overview of the holographic memory system will be described hereinbelow with reference to FIG. 1.

In FIG. 1, an encoder 25 converts digital data to be recorded in a volume holographic memory 1, into a dot pattern image of light and darkness in a plane, and rearranges the image in a data arrangement of, for example, 640 bits in a line and 480 bits in a row to generate a unitary-page sequence data. The unitary-page sequence data is supplied to an SLM (Spatial Light Modulator) 12 such as a panel of a transmission type Thin Film Transistor Liquid Crystal Display (hereinafter, referred to as "TFT-LCD" or "LCD").

The SLM 12 performs a modulation processing by the processing unit of 640 pixels in a line and 480 pixels in a row, which corresponds to a unitary page. More particularly, the SLM 12 performs light modulation of a light beam or a source beam into an on/off signal of spatial light, corresponding to the unitary-page sequence data from the encoder 25. The modulated source beam or a signal light beam (hereinafter, referred to simply as "signal beam") is conducted to a lens 13. More specifically, the SLM 12 passes therethrough the source beam in response to the Boolean value "1" of the unitary-page sequence data, which is an electric signal, and shuts off the source beam in response to the Boolean value "0" to thereby achieve electro-optical conversion in accordance with the contents of respective bits in the unitary page data. Accordingly, the signal beam of the unitary page sequence is generated by modulation of the source beam.

The signal beam is incident upon the volume holographic memory 1 through the lens 13. In addition to the signal beam, a reference light beam (hereinafter, referred to simply as "reference beam") is incident upon the volume holographic memory 1 at an angle β (hereinafter, referred to as "incident angle β") relative to a predetermined reference line perpendicular to an optical axis of the signal beam.

The signal beam and the reference beam interfere with each other within the volume holographic memory 1, and the resulting interference fringe is stored as a refractive index grating within the volume holographic memory 1, whereby recording of data is effected. Also, recording of three-dimensional data is made possible by angular-multiplexed recording of a plurality of two-dimensional plane data with variance of the incident angle β.

When reproducing the recorded data from the volume holographic memory 1, only the reference beam is made incident upon the volume holographic memory 1 at the same incident angle β as at the time of recording toward the center of a region where the signal beam and the reference beam intersect with each other. That is, reproducing the recorded data is different from recording data, in that the signal beam is not made to be incident. Therefore, diffracted light from the interference fringe recorded in the volume holographic memory 1 is conducted to a CCD (Charge Coupled Device) 22 in a light detector through a lens 21. The CCD 22 converts light and dark patterns of the incident beam into variations in intensity of an electric signal to output to a decoder 26 an analog electric signal having a level corresponding to brightness of the incident beam. The decoder 26 compares the analog signal with a predetermined amplitude (i.e., slice level) to reproduce data consisting of the corresponding "1" and "0".

Because recording is performed in a two-dimensional plane data sequence within the volume holographic memory as described above, the incident angle β of the reference beam is varied to enable the angular multiplexed recording. That is, the incident angle β of the reference beam is varied to enable of defining a plurality of two-dimensional planes wherein the plane is a unit of recording, within the volume holographic memory. Therefore, three-dimensional recording can be achieved. An example of angular multiplexed recording is described in Japanese Unexamined Patent Publication Kokai Nos. H2-142979 and H10-97174.

In a case where a volume holographic memory is employed as a dismountable large capacity recording medium, a position, at which the memory is mounted on an optical information recording and reproducing apparatus, affects a positional relationship between a CCD photodetector and a reproduced image. Therefore, the position, at which the volume holographic memory is mounted, is greatly related to the quality of reproduction signal by a CCD. Thus, a part of image data to be recorded is conventionally used for adjustment of position. However, it has been required that an optical strain, a displacement of a signal image, and the like occurs between a spatial light modulator to a CCD image element, which are generated by a volume holographic memory when the volume holographic memory is newly mounted, should be settled within a predetermined specified value.

Further, when the volume holographic memory in which data is recorded by a certain optical information recording and reproducing apparatus is reproduced by other optical information recording and reproducing apparatuses, a reproduced image is much deformed by a position dispersion between the volume holographic memory and the CCD image element at the time of recording and reproduction. Therefore, it is necessary to adjust the position of the CCD image element or the volume holographic memory to a substantial extent. Thus, the conventional volume holographic memory had a drawback in interchangeability.

OBJECT AND SUMMARY OF THE INVENTION

It is an object of the present invention to provide an optical information recording and reproducing apparatus having a holographic memory, which is capable of recording an interference pattern in high density and retains interchangeability.

According to the present invention, there is provided a holographic memory made of a photorefractive material, the holographic memory comprises: a nonvolatile refractive index grating corresponding to a three-dimensional light interference pattern of a coherent reference beam and a coherent signal beam, the coherent signal beam being modulated in accordance with positioning images.

According to another aspect of the present invention, each of the positioning images includes a continuous image or scattered images disposed symmetrically with respect to a point.

According to still another aspect of the present invention, the positioning images are scattered and disposed every page of a predetermined cycle.

According to further another aspect of the present invention, the positioning images are intensively disposed in a predetermined fixing region and are disposed every page of a predetermined cycle.

According to another aspect of the present invention, the holographic memory comprises a rotating uniaxial crystal having an optical axis, the optical axis being in parallel to a symmetrical axis of rotation of the rotating uniaxial crystal.

According to still another aspect of the present invention, the holographic memory comprises a rectangular parallelepiped uniaxial photorefractive crystal having an optical axis, the optical axis being in parallel to a plane of the rotating uniaxial crystal.

According to the present invention, there is provided an optical information recording and reproducing apparatus, the apparatus comprises: a holographic memory made of a photorefractive crystalline material; a support portion for detachably supporting the holographic memory; a reference beam supplying portion for supplying a coherent reference beam of a first wavelength incident on the holographic memory; a signal beam generating portion for supplying a coherent signal beam of the first wavelength, which is modulated in accordance with image data, incident on the holographic memory, intersecting therein the signal beam with the reference beam, and for generating a three-dimensional light interference pattern of the signal beam and the reference beam; a detecting portion for detecting a diffracted light from a refractive index grating of the light interference pattern in the holographic memory, due to irradiation of the reference beam; and a medium position adjusting portion for moving a position of the support portion, which supports the holographic memory, in accordance with a signal corresponding to positioning images from the detection portion, wherein the holographic memory includes a nonvolatile refractive index grating corresponding to a three-dimensional light interference pattern of a coherent reference beam and a coherent signal beam, the coherent signal beam being modulated in accordance with positioning images.

According to another aspect of the present invention, the medium position adjusting portion is provided with a mechanism for performing parallel motion of the holographic memory in a direction along an optical axis of an optical path of the signal beam from the signal beam generating portion and in two directions perpendicular to the optical axis of the optical path included in a meridional plane and a sagittal plane, respectively, and for performing rotation of the holographic memory around the optical axis of the optical path and the two directions.

According to another aspect of the present invention, the apparatus further comprises a detected position adjusting portion for shifting a position of the detecting portion in accordance with a signal corresponding to positioning images supplied from the detecting portion.

According to still another aspect of the present invention, the detected position adjusting portion is provided with a mechanism for performing parallel motion of a light receiving surface of the detecting portion in the direction along the optical axis of the optical path of the signal beam from the signal beam generating portion and in two directions perpendicular to the optical axis of the optical path included in the meridional plane and the sagittal plane, respectively, and for performing rotation of the surface around the optical axis of the optical path and around the two directions.

According to another aspect of the present invention, the apparatus further comprises a spherical-wave reference-beam supplying portion for making a coherent reference beam including a convergent spherical wave of a first wavelength incident upon the holographic memory.

According to further another aspect of the present invention, the spherical-wave reference-beam supplying portion is provided with a mechanism for performing rotation of a coherent reference beam including the convergent spherical wave of the first wavelength about the holographic memory.

According to still another aspect of the present invention, the holographic memory includes a predetermined fixing region, in which the positioning images are intensively disposed and arranged every page of a predetermined cycle; and further comprises: a positioning reference-beam supplying portion for making a coherent reference beam of the first wavelength incident only on the fixing region; and a positioning detecting portion for detecting a diffracted light from the refractive index grating of the light interference pattern in the fixing region, due to irradiation from the positioning reference-beam supplying portion.

According to another aspect of the present invention, the apparatus further comprises a gate beam supplying portion for supplying a gate beam incident on the holographic memory, by which a gate beam of a second wavelength for increasing photosensitivity of the holographic memory and for one of activating and deactivating the refractive index grating depending upon the existence or non-existence of the light interference pattern.

According to another aspect of the present invention, the gate beam supplying portion includes a superluminescent diode.

According to another aspect of the present invention, the gate beam supplying portion includes means for restricting irradiation of the gate beam on a region where the signal beam and the reference beam intersect with each other.

BRIEF DESCRIPTION OF THE DRAWINGS

FIG. 12 is a perspective view showing an essential part of an optical information recording and reproducing apparatus having a rectangular volume holographic memory according to a further embodiment of the present invention.

FIG. 13 is a view showing a configuration of a volume holographic memory system according to another embodiment of the present invention.

DETAILED DESCRIPTION OF THE EMBODIMENTS

Embodiments of the present invention will now be described with reference to the drawings.

Figure 1:
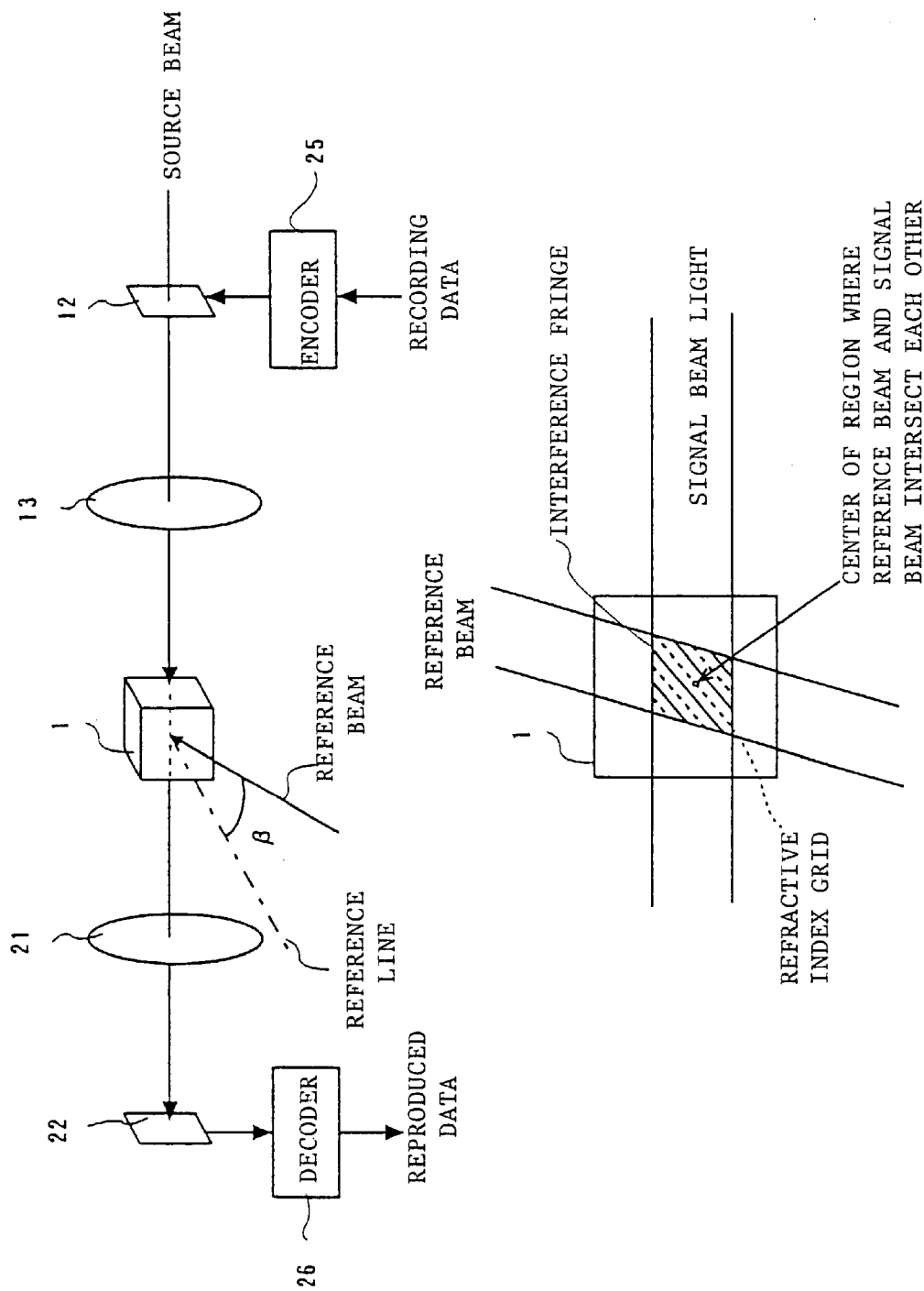
FIG. 1 is a diagram showing a configuration of a conventional volume holographic memory.
Figure 2:
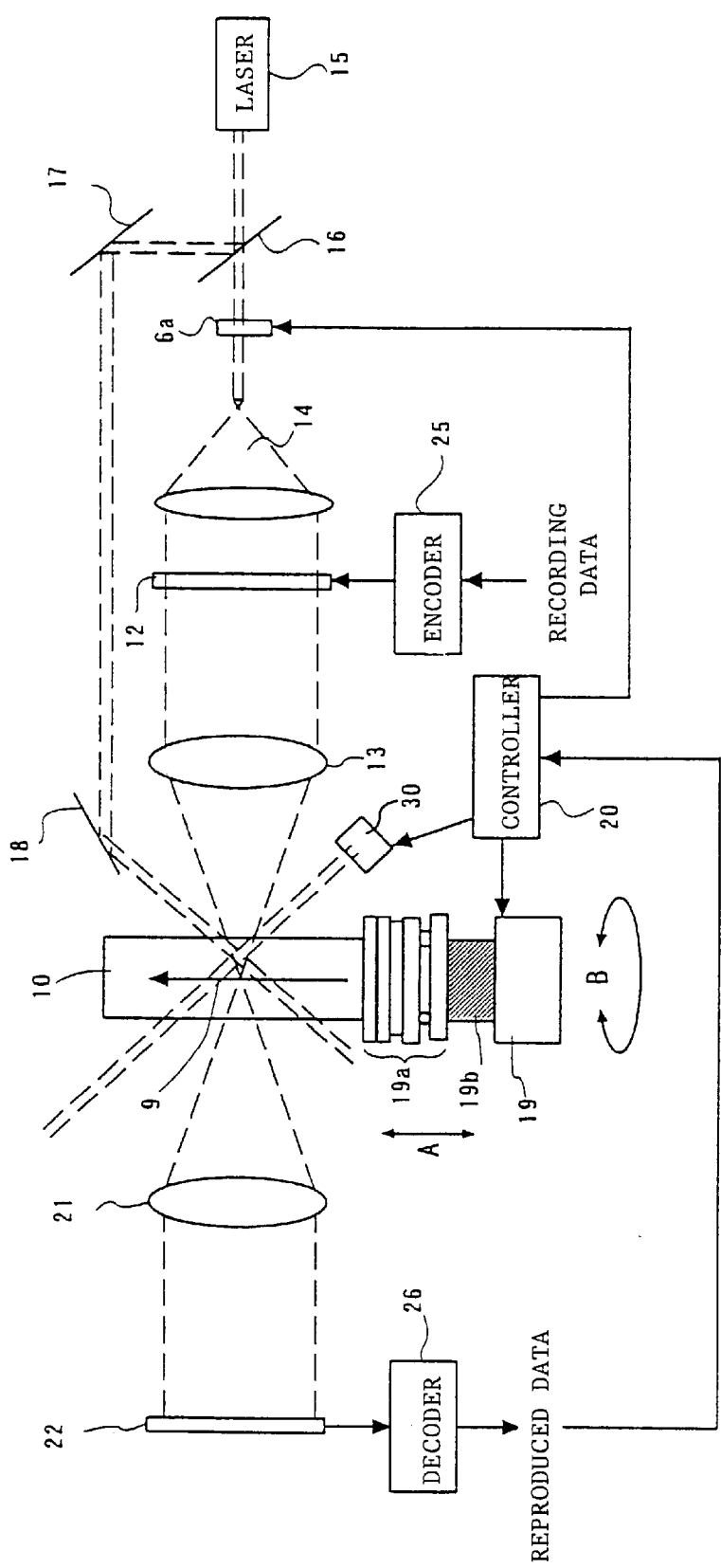
FIG. 2 is a side view showing a configuration of a volume holographic memory according to the present invention.

FIG. 2 shows an example of an optical information recording and reproducing apparatus using a volume holographic memory according to the present invention.

At the time of recording, a beam splitter 16 divides a light beam or a source beam emitted from a laser 15 into two beams, that is, a signal light beam (hereinafter, referred simply to as signal beam), which goes straight ahead, and a reference light beam (hereinafter, referred simply to as reference beam), which is deflected upward, the respective beams being conducted to optical paths for a signal light beam optical system and a reference light beam optical system.

A source beam having passed through the beam splitter 16 is made incident on a volume holographic memory 10 through a shutter 6a, a light beam expander 14, an SLM 12 and a Fourier transform lens 13. An automatic shutter controlled by a controller restricts a period of time, during which the source beam irradiates the volume holographic memory. The light beam expander 14 enlarges the source beam into a parallel light having a predetermined diameter. The SLM 12 is, for example, a two-dimensional surface LCD containing 640 pixels in a line and 480 pixels in a row, and converts the beam from the light beam expander 14 into a signal beam in accordance with digital recording data supplied from an encoder 25. After the spatial optical modulator 12 performs spatial modulation on the beam with a two-dimensional grating pattern (for example, a checkered pattern) or transmission/non-transmission for every pixel in accordance with the digital recording data, the beam is subjected to Fourier transformation by the Fourier transform lens 13. The transformed beam is condensed on the volume holographic memory 10, and is formed in the volume holographic memory 10 to provide a Fourier transform image.

The volume holographic memory 10 having a cylindrical form is arranged so that a Fourier plane provided by the lens 13 is parallel to a symmetrical axis of rotation of the volume holographic memory 10. The volume holographic memory 10 made of a photorefractive crystalline has a cylindrical body made of a uniaxial crystal, such as $LiNbO_3$, and an axis of the optical crystal is parallel to its rotational symmetry axis.

The reference beam is reflected by mirrors 17, 18 in the reference beam system to be incident upon the volume holographic memory 10, and is made to intersect and interfere with the signal beam from the lens 13 in a position within the medium to form a three-dimensional interference fringe. At this time, optical elements such as the mirror 18, the lens 13 and the like are arranged so that the reference beam and the signal beam interfere with each other not on the Fourier plane but in front of or inward of the Fourier plane. The reference beam and the signal beam are arranged in a flat plane, which contains a normal line perpendicular to the symmetrical axis of rotation of the volume holographic memory.

A superluminescent diode 30 adapted for generation of a gate beam is provided below a side of the volume holographic memory 10 so as to project the gate beam onto the side of the volume holographic memory 10. The gate beam includes a light beam of a second wavelength adapted to increase photosensitivity of the volume holographic memory 10. The second wavelength is different from those of the reference beam and the signal beam. The gate beam activates or deactivates a refractive index grating depending upon existence or non-existence of a light interference pattern in the volume holographic memory 10. Accordingly, the gate beam serves as an erasure light beam on the refractive index grating, which is produced by the light interference pattern.

Figure 3:
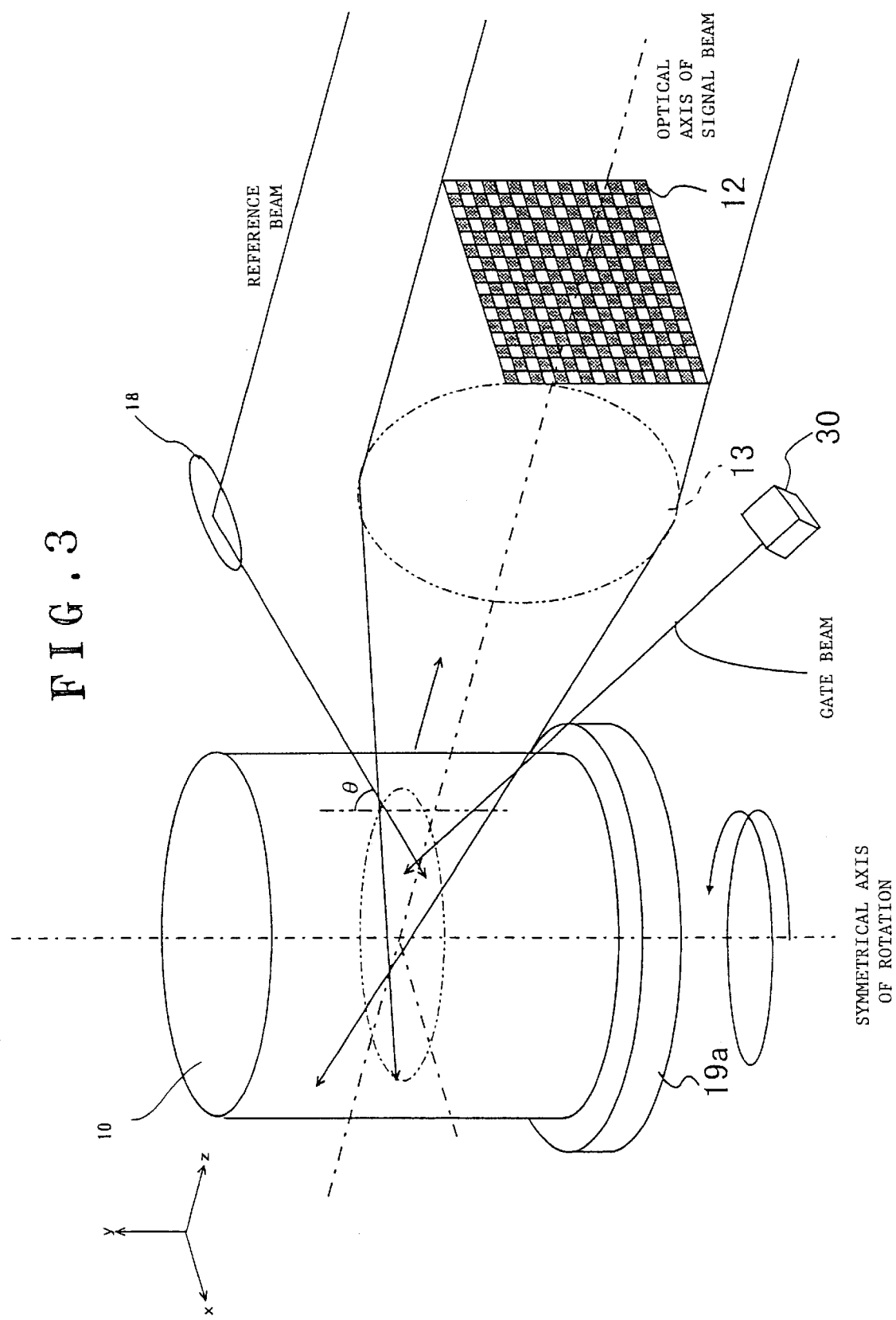
FIG. 3 is a perspective view showing an essential part of an optical information recording and reproducing apparatus having a cylindrical volume holographic memory according to the present invention.

The superluminescent diode 30, as a gate beam means, is arranged so as to restrict irradiation of the gate beam to a region where the reference beam and the signal beam intersect each other in the volume holographic memory 10, and is controlled between on and off operation by a controller 20. The gate beam is disposed in a plane including a normal line perpendicular to the symmetrical axis of rotation of the volume holographic memory as shown in FIG. 3. More specifically, the reference beam and the signal beam as well as the gate beam also intersect one another in a plane including the symmetrical axis of rotation of the cylindrical volume holographic memory or in a plane parallel to the plane including the rotational symmetry axis.

In this manner, when data is to be recorded, the reference beam, the signal beam and the gate beam simultaneously irradiate a predetermined part in the volume holographic memory 10 to record an interference pattern as a refractive index grating having refractive index variations. A period of time, during which a hologram is formed, is controlled by the automatic shutter provided in the laser beam source apparatus.

In the case where a Fourier plane is present in the volume holographic memory, the signal beam has a highest intensity on the Fourier plane, so that, when the reference beam interferes with a zero order beam of the signal beam on the Fourier plane, which has a high light intensity, the photorefractive effect becomes saturated to exhibit a tendency that a non-linear distortion is introduced in a recorded image. A problem of such non-linear distortion can be avoided by arranging the optical elements of the system such that the reference beam and the signal beam interfere with each other in front of or inward of the Fourier plane.

The cylindrical volume holographic memory 10 is disposed on a means, that is, a vertical and rotating movement mechanism, for moving the memory in a predetermined pitch in a direction along the axis of the optical crystal, and rotating the memory in a predetermined pitch about the symmetrical axis of rotation. The vertical and rotating movement mechanism is provided with a drive unit 19 and a vertical movement mechanism 19b, which includes a rotary table 19a and is connected to the drive unit 19. The controller 20 controls the drive unit 19 for rotation and vertical movements of the rotary table 19a.

The volume holographic memory 10 is disposed on the rotary table 19a so that the axis of the optical crystal 9 coincides with an axis of rotation of the drive unit 19. Rotation of the drive unit 19 causes the volume holographic memory 10 to move in a direction indicated by an arrow A in FIG. 2, and at the same time to rotate in a direction indicated by an arrow B in FIG. 2. The vertical movement of the volume holographic memory 10 in the direction indicated by the arrow A leads to a movement of the recorded position in the direction of the arrow A where the interference fringe formed by the reference beam and the signal beam in the volume holographic memory 10, so that the spatial multiplexed recording can be performed. Further, the volume holographic memory 10 rotates along the direction of the arrow B together with the rotary table 19a, whereby the surface, on which the interference pattern is recorded, is made to rotate. Thus, the angular multiplexed recording and the spatial multiplexed recording can be performed.

Figure 4:
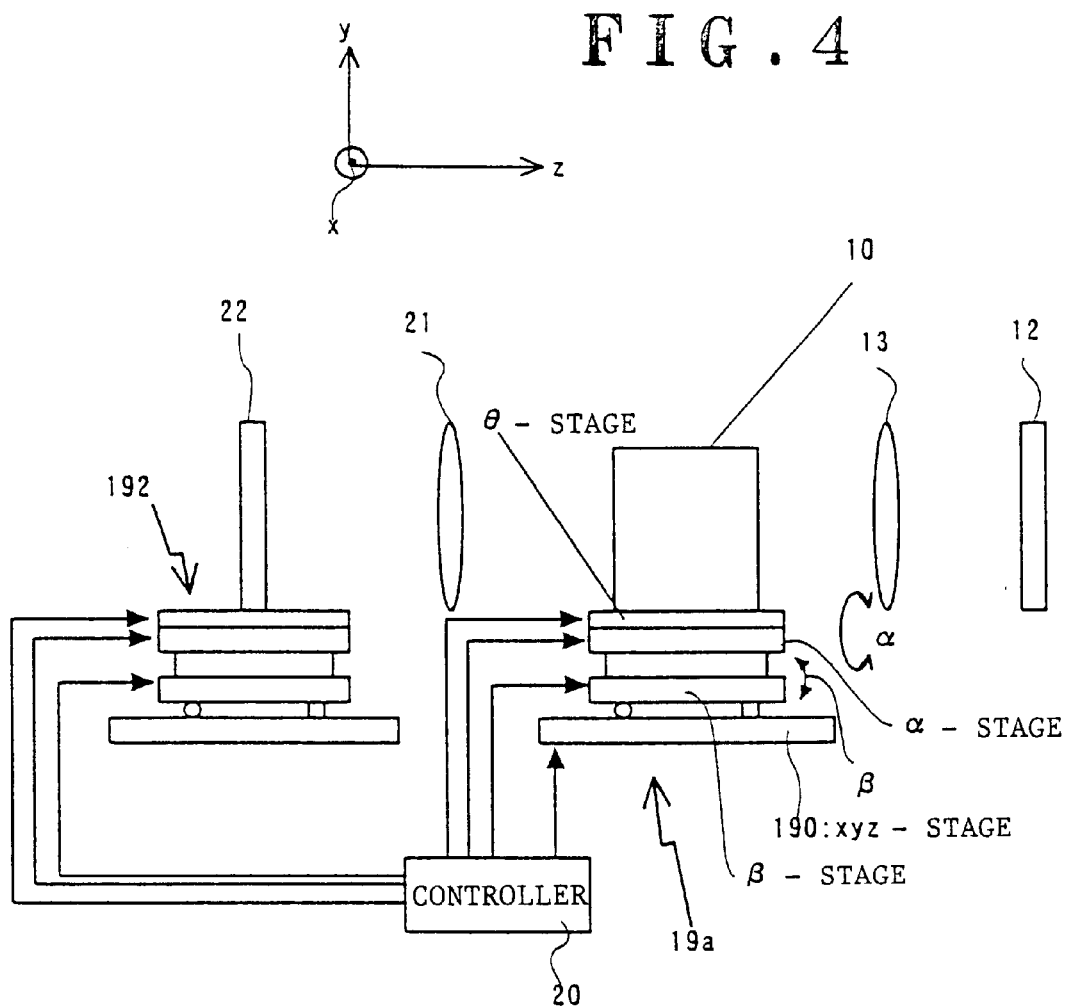
FIG. 4 is a side view showing an essential part of a volume holographic memory system according to an embodiment of the present invention.

The table 19a includes, as shown in FIG. 4, α-stage, β-stage and θ-stage placed and superposed successively on a xyz-stage 190, which is fixed to the vertical movement mechanism 19b to serve as a base. The α-stage, β-stage and θ-stage serve as a medium position adjusting means adapted to be controlled in position by the controller 20. As shown in FIG. 4, a direction along an optical axis of an optical path of the signal light beam being taken as a z direction and a meridional plane of the optical system which includes 13, 21 is taken as a yz plane while a sagittal plane of the optical system is taken as an xz plane. The α-stage, β-stage and θ-stage are supported at two points aligned in a predetermined direction, and are provided with level adjusting mechanisms, which performs level adjustment at a point aligned not with the two points on a straight line by means of screws rotatingly driven by step motors.

Figure 5:
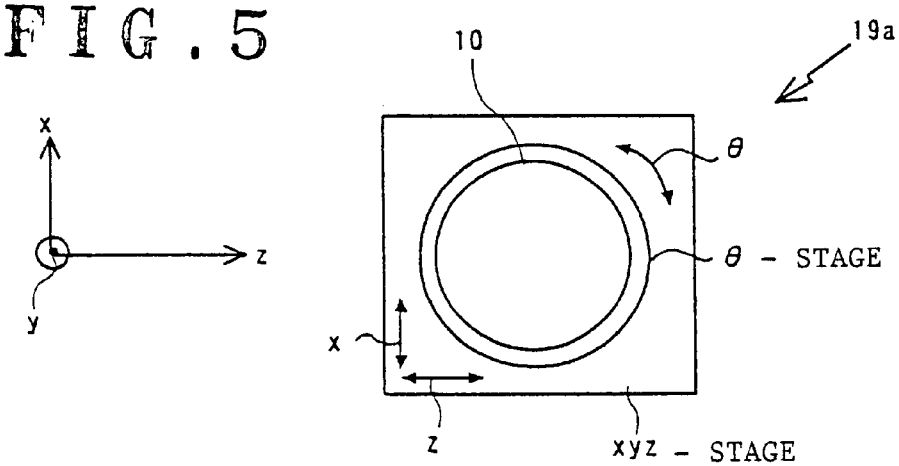
FIG. 5 is a plan view showing an essential part of a table for the volume holographic memory according to an embodiment of the present invention.

The α-stage rotates or tilts the volume holographic memory about an axis extending in the z direction. The β-stage rotates or inclines the volume holographic memory about an axis extending in the x direction. The θ-stage rotates or tilts the volume holographic memory about an axis extending in the y direction, as shown in FIG. 5. The stages α, β and θ can adjust a position of a medium. The xyz-stage 190 is provided, as shown in FIG. 5, with a rack and pinion mechanism, which is adapted to independently perform parallel motion and is rotatingly driven by, for example, a step motor.

In this manner, the medium position adjusting means of the table 19a is provided with a mechanism, which performs parallel motion of the volume holographic memory 10 in the z direction along the optical axis along the optical path of the signal light beam and in the two directions (i.e., x and y directions) perpendicular to the optical axis, which are included in the meridional plane (i.e., yz-plane) and the sagittal plane (i.e., xz-plane), and which performs rotating motion of the volume holographic memory about the optical axis and about the two x and y directions. The controller 20 uses a step motor or the like to drive the medium position adjusting means in accordance with a signal corresponding to the positioning image, which is supplied from the light-beam detecting means or a CCD 22, to move and adjust a position of the table 19a, which serves as a support means for supporting the volume holographic memory Further, the light beam detecting means or a CCD 22 is further provided with a detected position adjusting means 192, which shifts a position of a detecting means in accordance with a signal corresponding to the positioning image, which is supplied from the same detecting means as that of the table 19a.

The detected position adjusting means 192 also performs parallel motion of a light receiving surface of the CCD 22 in the z direction along the optical axis of the optical path of the signal light beam and in the two directions (i.e., x and y directions) perpendicular to the optical axis along the optical path, and included in the meridional plane (i.e., yz-plane) and the sagittal plane (i.e., xz-plane), and performs rotating motion of the volume holographic memory about the optical axis along the optical path and about the x and y directions. The controller 20 uses a step motor or the like to drive the detected position adjusting means in accordance with a signal corresponding to the positioning image, which is supplied from the CCD 22, to move and adjust a position of the CCD 22. It is not necessary to provide the detected position adjusting means 192 in the case where a manufacturing error of the apparatus is small, but the provision of the means enhances an accuracy of the recording and reproduction operation.

The cylindrical volume holographic memory 10 has a nonvolatile refractive index grating, which corresponds to a three-dimensional light interference pattern of the reference beam and the signal beam and modulated in accordance with the positioning image. After the positioning image has been recorded in the cylindrical volume holographic memory 10 by the optical information recording and reproducing apparatus, the positioning image is beforehand fixed in the cylindrical volume holographic memory 10 by an application of heat or intense electric field.

One or more pages of the positioning image which are made nonvolatile by fixing (for example, a thermal fixing or application of intense electric field) are recorded in advance, whereby the CCD and the controller can generate an error signal concerning to an image formation of an information image on the CCD upon the exchange of the volume holographic memory.

With a system for performing spatial multiplexed recording of, for example, 10000 pages in one multiplexing channel, an image containing position and page information is periodically subjected to exposure every one page to 500 pages, and a refractive index grating is subjected to thermal fixing to be made nonvolatile so that the image is beforehand recorded in the volume holographic memory. When the volume holographic memory is mounted on an optical information recording and reproducing apparatus, the apparatus can adjust a positional relationship between the CCD and the volume holographic memory with a predetermined accuracy by scanning one channel of a part of the volume holographic memory and reproducing the position signal.

Figure 6A:
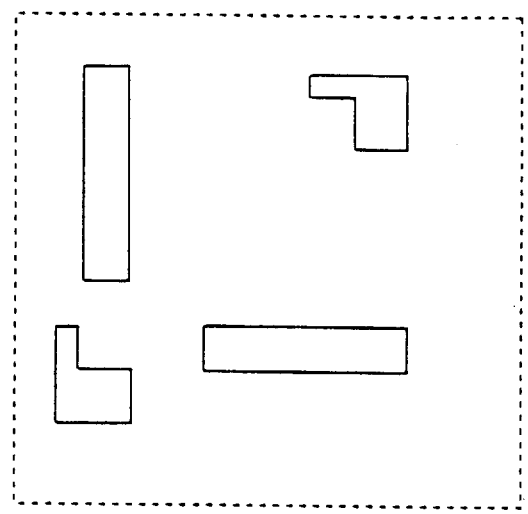
FIGS. 6A and 6B show positioning images to be recorded in the volume holographic memory according to an embodiment of the present invention.
Figure 6B:
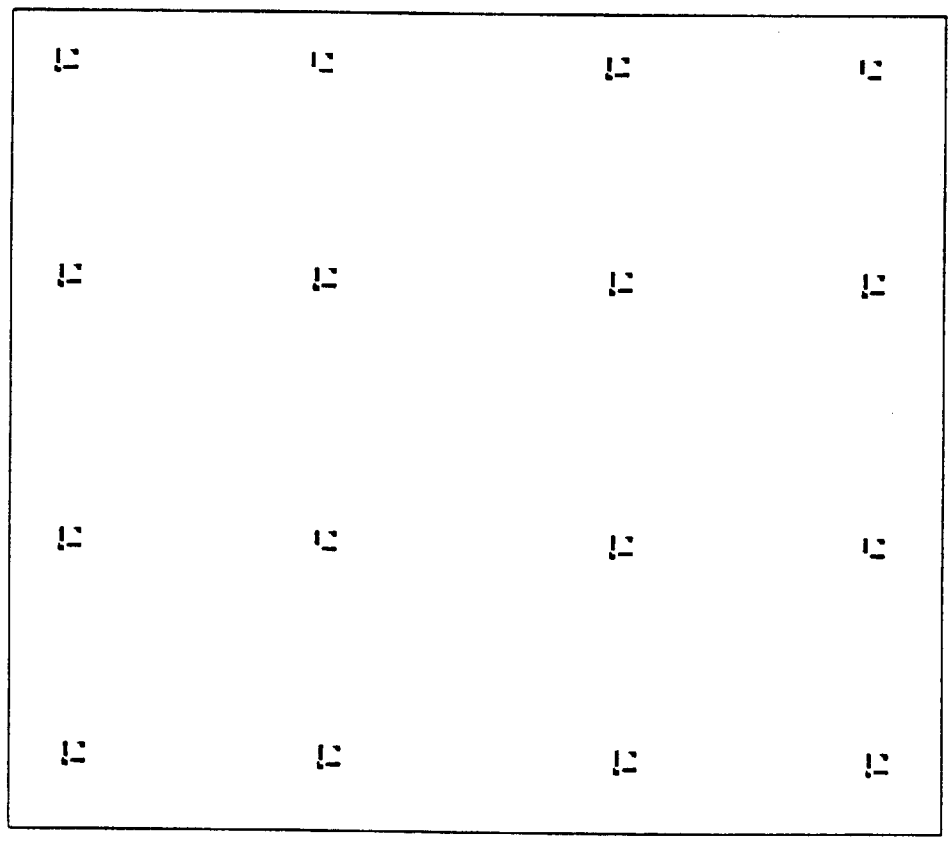

For example, an image as shown in FIG. 6A is used as a unitary image. A positioning image including the unitary images, which are regularly and uniformly arranged as shown in FIG. 6B, is prepared. A plurality of the image pages are recorded in one stack (minimum unit of a spatial multiplexing recording), and thermal fixing is effected on the volume holographic memory. The positioning image is dispersed and arranged over every page at a predetermined cycle.

Multiplexed recording of 10000 pages per one stack can be achieved by, for example, performing angular multiplexing of 1000 pages, four-fold multiplexing in fractal multiplexing, and twenty-five fold multiplexing in wavelength multiplexing. In this case, known positioning image patterns (FIGS. 6A, 6B) are recorded every 250 pages of angular multiplexing and every 750 pages of angular multiplexing. At this time, the same data are recorded in a separate recording portion of the same angle as that of the fractal multiplexing and the wavelength multiplexing process. Therefore, the beginning of the recorded images in reproduction is easily found by temporarily decreasing selectivity in the fractal multiplexing and wavelength multiplexing process (that is, using the reference beam of the condensing system in the case of fractal multiplexing and enlarging a bandwidth of transmission wavelength in the case of wavelength multiplexing).

At the time of reproduction, the volume holographic memory 10, in which recording has been performed in the above-described manner, is arranged on the rotating movement mechanism similarly to the time of recording, the controller 20 controls closure of the shutter 6a and controls the superluminescent diode 30 between on and off operation so that only the reference beam from the mirror 18 is supplied to be incident.

Diffracted light by the interference fringe recorded in the volume holographic memory 10 is made incident as a reproduced light on the CCD 22 through the inverse Fourier transform lens 21 to form a reproduced image. The CCD 22 includes a two-dimensional light-receiving plane having 640 pixels in a line and 480 pixels in a row, like the SLM 12. The CCD 22 converts the received reproduced light into an electric signal to supply to a decoder 26. The decoder 26 compares the input electric signal with a predetermined slice level to output binary digital data.

The controller 20 performs position-adjustment control. Also, while positioning may be effected only for an image on the 250th page, further using an image on the 750th page may effect positioning of higher accuracy.

Figure 7:
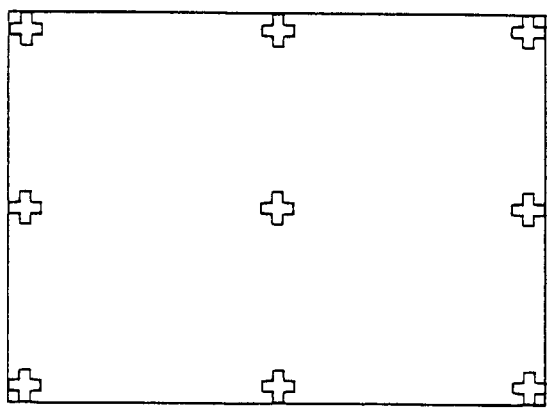
FIG. 7 is a front view showing a positioning image to be recorded in the volume holographic memory according to a further embodiment of the present invention.
Figure 9:
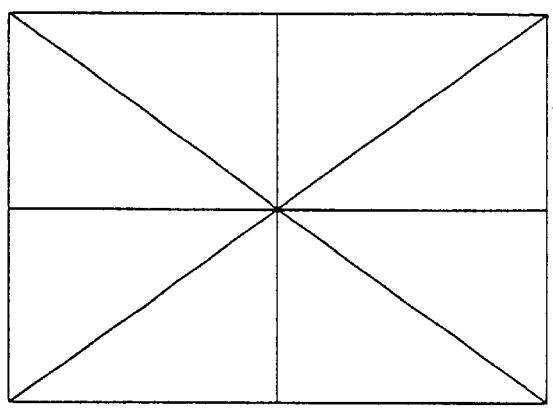
FIG. 9 is a front view showing a positioning image to be recorded in the volume holographic memory according to a further embodiment of the present invention.
Figure 8:
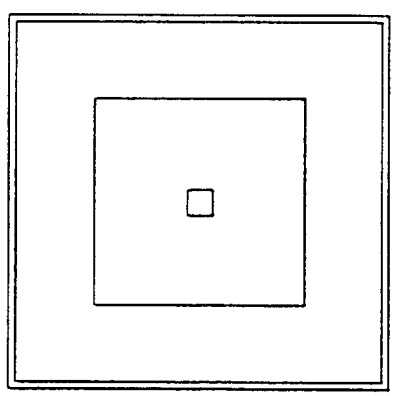
FIG. 8 is a front view showing a positioning image to be recorded in the volume holographic memory according to a still further embodiment of the present invention.
Figure 10:
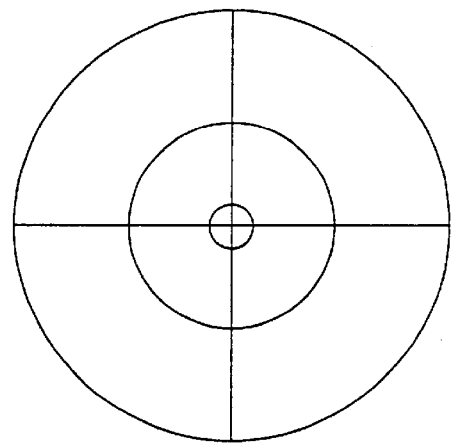
FIG. 10 is a front view showing a positioning image to be recorded in the volume holographic memory according to a still further embodiment of the present invention.

Pixels for positioning may be arranged in a dispersed manner as in the configuration as shown in FIG. 6B and FIG. 7, and may be arranged in a configuration shown in FIG. 8, in which diagrammatic patterns consisting of squares are concentrically arranged. Further, such configurations may be combined to provide a combination of oblique lines and rectangles as shown in FIG. 9 and a combination of oblique lines and circles as shown in FIG. 10. In view of crosstalk effected on data by users, it is more preferable to suppress an amount of information for the entire images by employing dispersed data.

A configuration of an image itself may be of a square form as shown in FIG. 8 or a circular form as shown in FIG. 10 independently from the configurations of the CCD and the SLM. The configuration of the image is preferably circular as shown in FIG. 10 to have a performance of the image forming system at the maximum efficiency. Also, as in the case of a cylindrical volume holographic memory having a curved surface, on which the reference beam is incident, it is preferable that an image is arranged so that a width in the x direction of a light beam incident upon the xz surface where the curvature is present is made minimum. More particularly, in the case where the cylindrical volume holographic memory is mounted in a manner shown in FIG. 3, the signal beam should not be incident in a direction shown in FIG. 7 but had better be incident so that the image in FIG. 7 is turned 90 degrees so as to have its long side in parallel to the y direction.

Figure 11A:
FIGS. 11A through 11I show positioning images to be recorded in the volume holographic memory according to a further embodiment of the present invention.
Figure 11B:
Figure 11C:
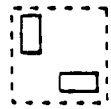
Figure 11D:
Figure 11E:
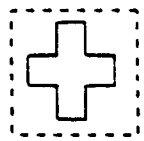
Figure 11F:
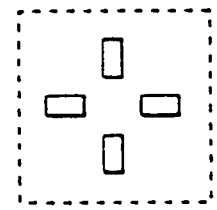

FIGS. 11A through 11I show examples of image unit patterns for the actual calculation of a positioning error signal in the respective images. The simplest way is to determine positional displacement by detecting a single pixel as shown in FIG. 11A. In this method, accuracy of the optical system is low because the number of pixels for output of signals is small. In other word, in the case where there is a possibility that the volume holographic memory is greatly displaced from a normal position, a detected signal itself is buried in noise and may not be detected.

Figure 11G:
Figure 11H:
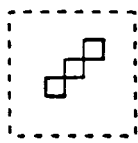
Figure 11I:
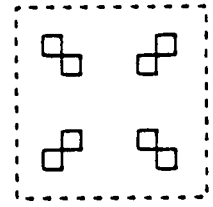

A large noise margin can be ensured by enhancing a signal level with a plurality of pixels as one unit as shown in FIGS. 11B to 11I. In this case, in order to more easily detect displacement in horizontal and vertical directions, calculation of the respective errors is made easier when reference pixels for calculation of error amount are separately arranged into horizontal and vertical components, respectively. Also, information of horizontal and vertical displacement can be detected by arranging rows of pixels obliquely as shown in FIGS. 11G to 11I. In this manner, it is preferable that each of positioning images is composed of scattered images disposed symmetrically with respect to a point or continuous images.

It should be noted that while the movement mechanism is shown in the present embodiment to perform angular multiplexed recording and spatial multiplexed recording at the same time, one of the multiplexed recordings can be performed by the use of a movement mechanism, which performs one of the vertical movements of the volume holographic memory 10 in the direction (arrow A) along the optical axis of the volume holographic memory 10 and rotating movements of the volume holographic memory (arrow B).

Also, in place of the vertical and rotating movement mechanism, it is possible to employ a movement mechanism which can control movements of the volume holographic memory separately in the direction along the optical axis thereof and rotating movements thereof. For example, a configuration is possible, in which the volume holographic memory is rotated in the direction of rotation by an ultrasonic motor or the like, and feeding movements of the volume holographic memory in the direction along the optical axis of the volume holographic memory are controlled by a separate uniaxial moving stage.

In this manner, a so-called 2-color volume holographic memory system is achieved, in which the reference beam and the signal beam of the first wavelength are irradiated on the volume holographic memory and simultaneously a gate beam, which is of a second wavelength different from the first wavelength is irradiated. The gate beam has an effect of increasing the photosensitivity of the volume holographic memory. The interference fringe is recorded at the portion in the volume holographic memory where the reference beam, the signal beam and the gate beam are irradiated.

The 2-color volume holographic memory system can resolve a disadvantage in a conventional, so-called 1-color volume holographic memory system, in which only one laser of one wavelength is used as a light source for the reference beam and the signal beam. The disadvantage is that the recorded information present on the respective optical paths of the reference beam and the signal beam after the recording of interference fringe is erased by the reference beam and the signal beam.

In the 2-color holographic memory system described above having a rotating volume holographic memory, such as a cylindrical volume holographic memory, signals are sequentially recorded at a portion of the volume holographic memory, where three light beams (that is, the gate light beam, the reference beam and the signal beam) intersect one another. For example, after the rotary table 19a rotates the cylindrical volume holographic memory 10 around the axis of rotation as shown in FIG. 3 to thereby terminate recording over 360 degrees in a circle (indicated by two-dot chain line) on the outermost periphery, the cylindrical volume holographic memory 10 is moved in a direction (z direction) of the optical axis of the optical path of the reference beam to be scanned relative to the reference beam and the gate light beam, and a recording position is moved, for example, one step toward the inner periphery. Subsequently, recording is performed 360 degrees in one circle as in the case of the outermost periphery. The above operations are repeated whereby information is spatially recorded in concentric circles in one layer in the rotating volume holographic memory. In this case, spiral recording may be performed by making the rotation of the volume holographic memory in synchronism with the scanning of the reference beam and the gate light beam.

FIG. 12 shows a further embodiment of the present invention, in which a volume holographic memory made of a photorefractive crystalline material is in the form of a rectangular parallelepiped 10 of a uniaxial crystal with the axis of optical crystal in parallel to one plane thereof. The volume holographic memory can perform parallel motion and rotation independently in the x, y and z directions of the rectangular parallelepiped. The controller 20 controls the table 19a for recording on a first layer of the rectangular parallelepiped volume holographic memory 10 so that the volume holographic memory 10 is moved horizontally (i.e., in the x direction) at the same level. Thereafter, the volume holographic memory 10 is moved at the same time in a depth direction (i.e., in the z direction) to scan the reference beam and the gate light beam, so that a recording position P is shifted one step inside to perform the same recording as described above.

FIG. 13 shows another embodiment, wherein the present invention is applied to an angular multiplexing recording system. The angular multiplexing recording system includes a pair of galvanomirrors to vary an incident angle of the reference beam relative to a side surface of the rectangular parallelepiped volume holographic memory 10 as shown in FIG. 13. One of the pair of galvanomirrors is turned to make the reference beam incident toward a point in the volume holographic memory 10 to change an incident angle of the reference beam.

In addition to the reference light beam optical system, which is used by a user for reproduction of recorded images and which includes the beam splitter 16, the mirrors 17, 18 and the galvanomirrors, in the embodiment shown in FIG. 13 there is provided a spherical wave reference beam means having a beam splitter 16b, a mirror 17b and a rotatable concave mirror 18b for reproducing the positioning images. The concave mirror 18b generates a divergent spherical wave from a plane wave of the light source. A relay lens system 180 causes the divergent spherical wave to generate a convergent spherical wave. Rotation of the concave mirror 18b causes the reference beam of the convergent spherical wave to be made incident upon and concentrated on a point in the volume holographic memory 10, and an incident angle of the reference beam to be varied.

The reason why the reference beam of the spherical wave is used for reproduction of the positioning images is as follows.

Figure 14:
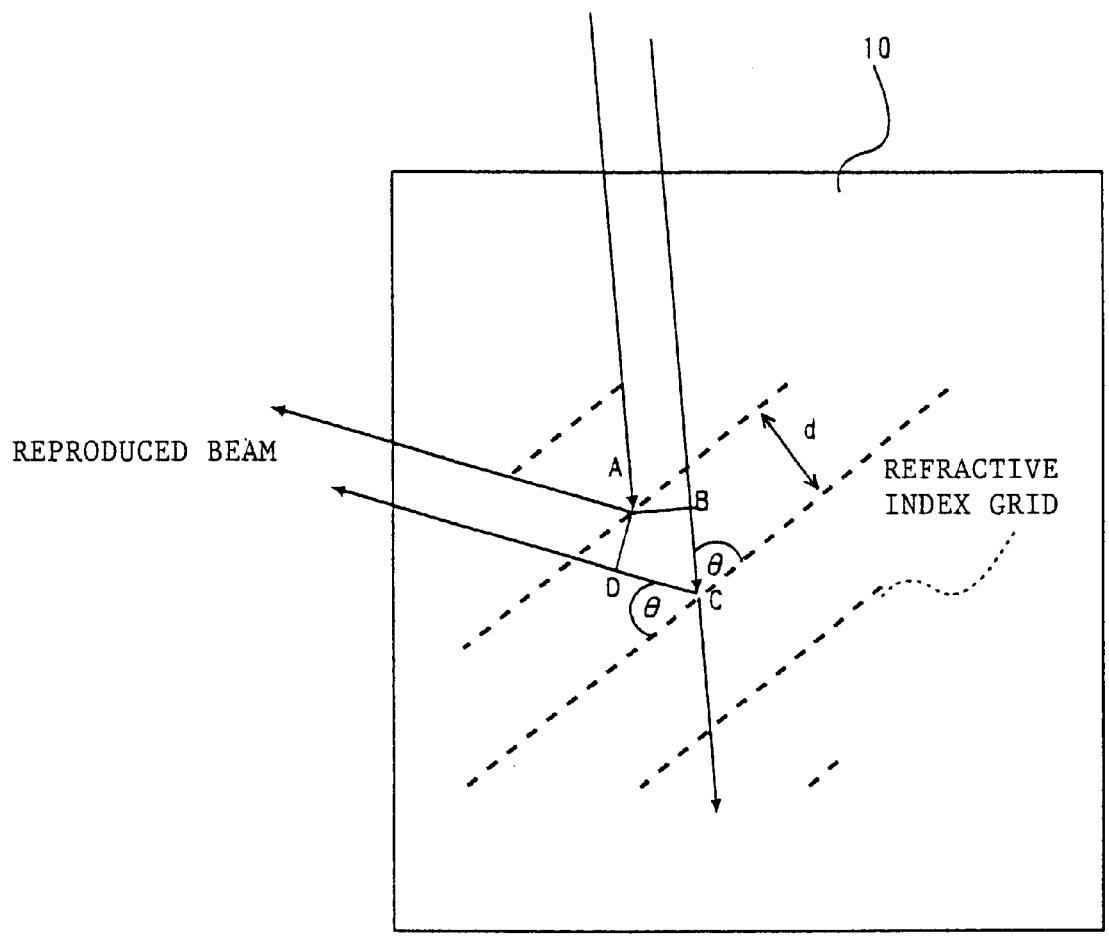
FIG. 14 is a side view showing a volume holographic memory according to a still further embodiment of the present invention.

It has been known that interference of scattered light from many layers is responsible for a Lippmann hologram selectively reflecting a light beam of a particular wavelength at a particular angle. As shown in FIG. 14, a plane of the volume holographic memory 10, in which interference fringe is recorded as the refractive index grating, includes a plurality of layers having refractive index differences to scatter an incident light of a wavelength $\lambda$. Among light beams scattered by the interference fringe, which is recorded in many layers with an equal spacing d, light beams which are subjected to mirror reflection by surfaces of the layers are the same in phase, and enhance in intensity one another. Further, taking account of scattered waves for a subsequent plane, AB and AD in FIG. 14 constitute planes of the same phase, and the light beams enhance one another when a length of optical path from B to D through C is several integer times as the wavelength, so that light beams of wavelengths, which satisfy the relationship $$2d \cdot \sin\theta = m\lambda$$

where "m" is an integer, $\theta$ is an incident angle relative to the respective layers, and "d" is a spacing when the Bragg requirement is met, are intensely reflected. By virtue of the interference of the scattered light beams from the plurality of layers, only light beams of a wavelength having been used for recording are reflected at a particular angle and any conjugate image is not produced even when reproduced with light beams of a wavelength having a wide bandwidth.

Because the reference beam of the spherical coherent wave contains waves having incident angles of a wide range, a positioning image can be formed in a particular direction by light beams, which are reflected at an angle corresponding to the reference beam with an incident angle at the time of recording the positioning image. Accordingly, by using a concentration type reference beam of the spherical wave, a position where the positioning image is formed can be readily found if a reflection point of the concave mirror 18b and a convergence point in the volume holographic memory 10 could be specified.

The spherical wave reference beam means is provided with a mechanism, which uses a rotating mechanism such as a step motor for the concave mirror 18b and the relay lens system 180 to rotatingly move the reference beam of the convergent spherical wave about the convergence point in the volume holographic memory 10. When the rotating and moving mechanism for the reference beam of the convergent spherical wave is used, a plurality of the positioning images can be reproduced not only by a reference beam of the spherical wave in a particular direction but also by a plurality of reference beams of the spherical wave in a plurality of directions. Therefore, positional control of the volume holographic memory 10 is made possible at higher accuracy.

Figure 15:
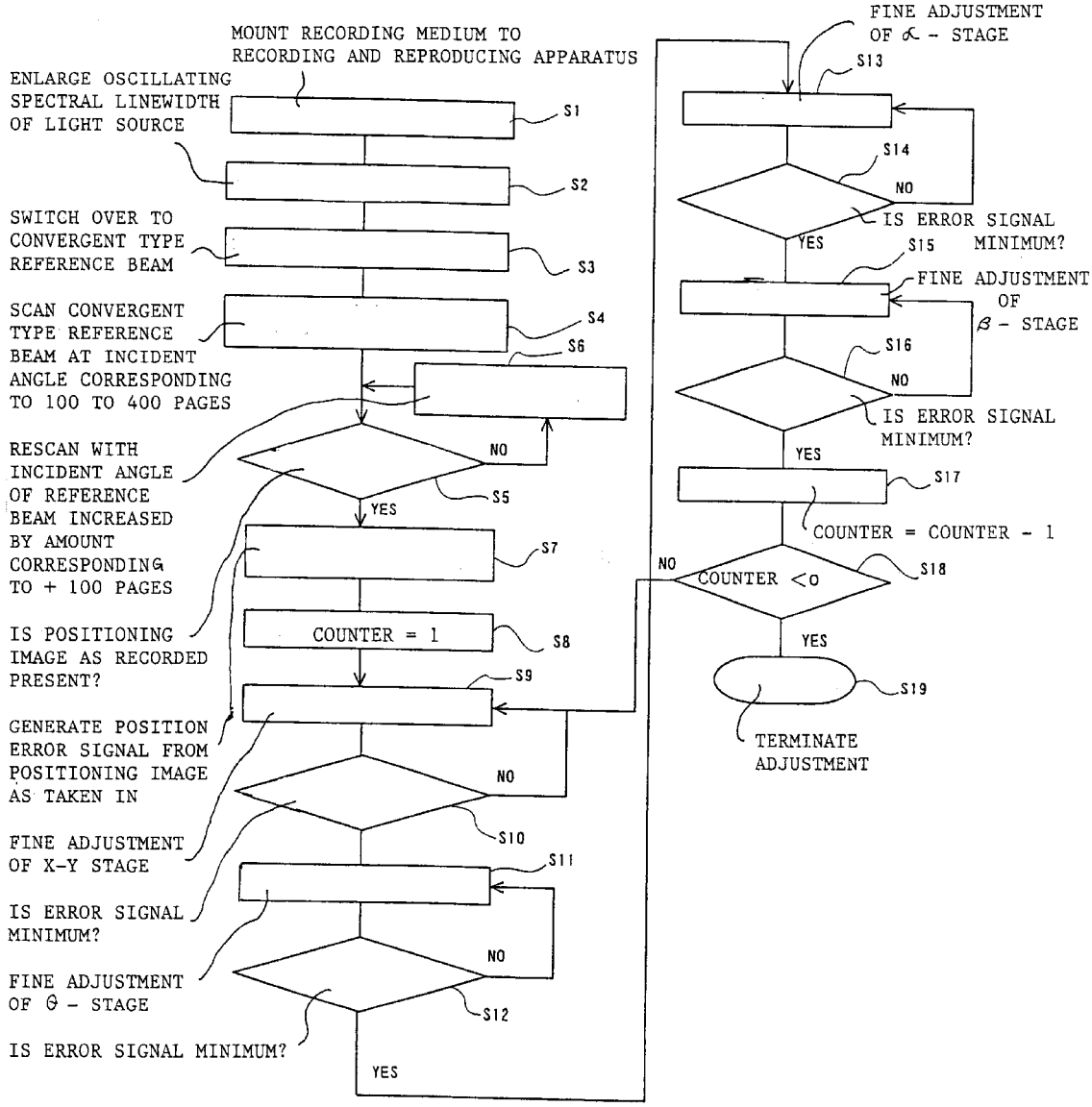
FIG. 15 is a flowchart showing the process flow of a controller to perform position control of a volume holographic memory according to a further embodiment of the present invention.

The controller 20 carries out process steps shown in a flow chart in FIG. 15 to perform positional control of the volume holographic memory 10 and expose the volume holographic memory 10 to only the reference beam of the plane wave at the time of reproduction in the same way as the time of recording.

At step S1, in the process of the positional adjustment by the controller 20, it is detected that the volume holographic memory 10 as a recording medium is mounted to the table 19a of the optical recording and reproducing apparatus. At step S2, a spectral linewidth of the light source 15 such as a wavelength-variable laser is enlarged. At step S3, the shutters 6a and 6b are closed but only the shutter 6c is opened to conduct a plane wave from the light source 15 to the concave mirror 18b to switch the wave to the convergent type reference beam of spherical wave. At step S4, the step motor is driven to rotate the concave mirror 18b to scan the convergent type reference beam at an incident angle corresponding to 100 to 400 pages to make the beam incident upon the volume holographic memory 10.

At step S5, presence or non-presence of the positioning images which has been recorded is determined. In the event that no positioning image having been recorded, an incident angle of the reference beam is increased at step S6 by an amount corresponding to +100 pages to scan the convergent type reference beam to make incident upon the volume holographic memory 10. In the event that a positioning image or images having been recorded, a position error signal is generated at step S7 from the positioning image that is taken in. At step S8, an initial value 1 of a counter is set. At step S9, the xyz-stage 190 is made to perform parallel motion independently in the x, y and z directions for fine adjustment. At step S10, it is determined whether the position error signal is a minimum or not. If the position error signal is not a minimum, step S9 is repeated. If the position error signal is a minimum, the θ-stage is rotated about an axis extending in the y direction for fine adjustment at step S11. At step S12, it is determined whether the position error signal is a minimum or not. If the position error signal is not a minimum, step S11 is repeated. If the position error signal is a minimum, the α-stage is rotated about an axis extending in the z direction for fine adjustment at step S13. At step S14, it is determined whether the position error signal is a minimum or not. If the position error signal is not a minimum, step S13 is repeated. If the position error signal is a minimum, the β-stage is rotated about an axis extending in the x direction for fine adjustment at step S15. At step S16, it is determined whether the position error signal is a minimum or not. If the position error signal is not a minimum, step S15 is repeated. If the position error signal is a minimum, the counter value is decreased one by one at step S17. At step S18, it is determined whether the counter value is less than zero or not. If the counter value is not less than zero, step S9 and the subsequent step's are repeated. If the counter value is less than zero, positional adjustment for the detection of the positioning image or images is terminated at step S19.

A reference position is determined by the positional adjustment of the rectangular parallelepiped volume holographic memory 10, the shutters 6a and 6c are closed and the shutter 6b is opened to conduct a plane wave from the light source 15 to the mirror 18 to switch to the reference beam of the plane wave, thus starting reproduction. It should be noted that while the rectangular parallelepiped volume holographic memory 10 is used in this embodiment, a rotating volume holographic memory such as a cylindrical volume holographic memory can be used to effect reproduction in the optical information recording and reproducing apparatus.

Figure 16:
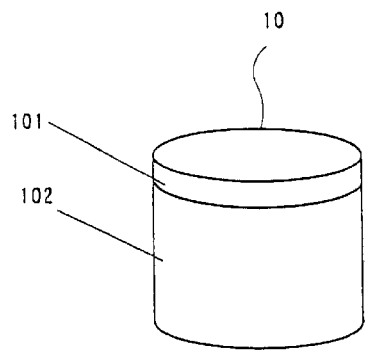
FIG. 16 is a perspective view showing a cylindrical volume holographic memory according to a still further embodiment of the present invention.
Figure 17:
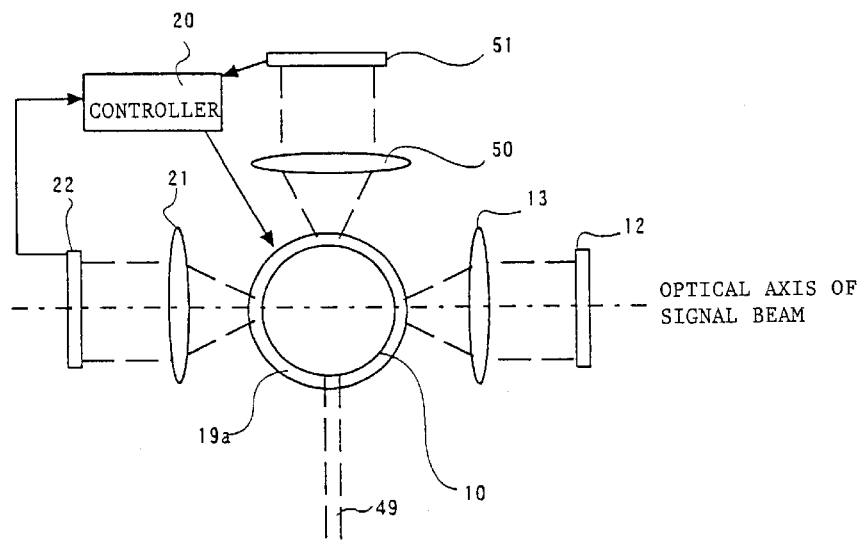
FIG. 17 is a side view showing an essential part of a volume holographic memory according to a further embodiment of the present invention.

A further embodiment is shown in FIG. 16. The system is capable of performing real-time servo-control on shaft rotation during the reproduction of the volume holographic memory.

In the system capable of performing real-time servo-control, the rotating volume holographic memory such as a cylindrical volume holographic memory is provided as shown in FIG. 16. A predetermined positioning fixing region 101, on which positioning images are intensively disposed (i.e., concentrated and disposed) and are arranged every page at a predetermined cycle, can be provided at one end, and a user region 102, on which image data used by a user is recorded and reproduced at a remaining portion of the memory.

The above-mentioned apparatus capable of performing real-time servo-control comprises a positioning reference beam means and a positioning detection means, in addition to a reference beam means, a signal beam means and a gate light beam means, which are exclusively used for image recording and reproduction in the user region 102 for recording and reproduction of image data. The positioning reference beam means is provided for making a coherent reference beam 49 of a first wavelength incident only upon the fixing region 101 of the volume holographic memory 10. The positioning detection means includes an inverse Fourier transform lens 50 and a CCD 51, which detect a diffracted light from the refractive index grating of light interference pattern in the fixing area due to irradiation of the coherent reference beam 49. The coherent reference beam 49 is conducted from the common light source by means of a beam splitter and a mirror (not shown) in the same manner as in the above-mentioned embodiment.

Figure 18:
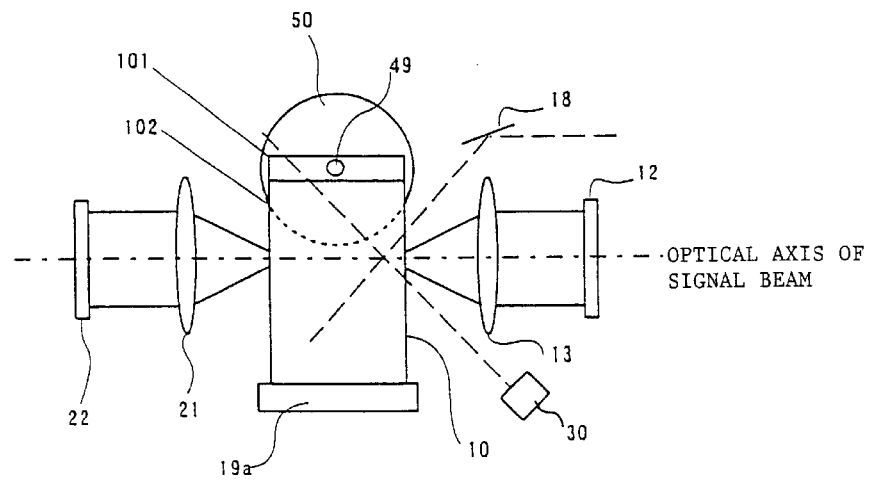
FIG. 18 is a plan view showing an essential part of a table for a volume holographic memory according to a still further embodiment of the present invention.

As shown in FIG. 18, the positioning reference beam means and the positioning detection means are arranged in such a manner that an optical axis of the coherent reference beam 49 is present at a different level for reproduction of the positioning image from a level of image recording and reproduction in the user region 102, at which an optical axis of the signal beam passing through the signal beam optical system consisting of the SLM 12 and the Fourier transform lens 13, and the detection optical system consisting of the inverse Fourier transform lens 21 and the CCD 22 is positioned.

In this manner, the volume holographic memory 10 is used, wherein positioning images are intensively disposed on the predetermined fixing region 101 as the refractive index grating, which is fixed and made nonvolatile by application of heat or intense electric field, and arranged every page at a predetermined cycle in the fixing region. Further, the positioning reference beam means for reproducing the positioning images and the light beam detecting means are provided independently of a means for recording and reproducing of normal image data. Thus, positional adjustment of the volume holographic memory enables real-time servo-control unlike the above-mentioned embodiments.

The optical information recording and reproducing apparatus having the volume holographic memory, in which the positioning images are used. The apparatus is of a system, wherein many premarks are formatted at a predetermined spacing or arrangement as the positioning images, and displacement of a reproduced image from a center of the reference image is detected to provide a positioning error signal, so that the following effects are obtained.

Since the servo-control region, in which positioning images for detection of a positioning error signal are recorded and fixed, is separated in terms of time and space fully from the data region where data is read and written, there is no interference between a data signal and the positioning error signal. Accordingly, an index region containing an address region, a data region, and the positioning error signal before, during and after data recording are not varied at all. Thus, the apparatus is very stable in operation.

If premarks are completely preformatted symmetrically relative to a center of an image, the optical system can be considerably mitigated in accuracy, and is not affected by inclination of the volume holographic memory, so that the volume holographic memory is improved in interchangeability.

In the present invention, defects of the volume holographic memory in the data region do not affect the positioning error signal, since the positioning error signal is obtained from the servo-control region. Even if defects are involved, it is possible to avoid the adverse effect on the positioning error signal due to the defects.

Because an image unit bit in the positioning image in the servo-control region is known to be present in a predetermined location such as a sampling point, and abnormality can be easily detected, so that defects in the image unit bit can be detected if a reproduction pattern of a detected signal when the premark is normal is compared with a pattern of an actual reproduction signal wave. When the defects are detected, influences of defects in the image unit bit can be eliminated by the use of an error signal in a preceding sampling point in the servo-control region.

Further, if a position of a first premark of the image unit bit is positioned to be displaced every page of a predetermined spacing, a position information can be detected even when a light beam performs parallel motion or rotation relative to the volume holographic memory at high speed. A position information can be detected because when the light beam moves, a difference in output from a sample holding circuit is produced between when the beam passes a group of images with the timing of sample holding in synchronism with one another in a state, in which the timing of sample holding of the first premark is fixed at all times, and when the position of the first premark is displaced.

As described above, the present invention provides a refractive index grating, which is made nonvolatile and corresponds to a three-dimensional light interference pattern of a coherent signal beam and a coherent reference beam, which are modulated in accordance with positioning images in a volume holographic memory, so that a volume holographic memory can be obtained, which is capable of recording the interference pattern in high density and has interchangeability. Also, precise positional control of the volume holographic memory in an optical information recording and reproducing apparatus is made possible.

The present invention has been described with reference to the preferred embodiments thereof. It should be understood by those skilled in the art that a variety of alternations and modifications may be made from the embodiments described above. It is therefore contemplated that the appended claims encompass all such alternations and modifications.

What is claimed is:

1. An optical information recording and reproducing apparatus, said apparatus comprising:

a holographic memory, including a plurality of pages, made of a photorefractive crystalline material;

a support portion for detachably supporting said holographic memory;

a reference beam supplying portion for supplying a coherent reference beam of a first wavelength incident on said holographic memory;

a signal beam generating portion for supplying a coherent signal beam of the first wavelength, which is modulated in accordance with image data, incident on said holographic memory, intersecting therein said signal beam with said reference beam, and for generating a light interference pattern of said signal beam and said reference beam;

a detecting portion for detecting a diffracted light from a refractive index grating of the light interference pattern in said holographic memory, due to irradiation of said reference beam and a medium position adjusting portion for moving a position of said support portion, which supports said holographic memory, in accordance with a signal corresponding to a positioning image from said detecting portion, wherein said holographic memory includes a nonvolatile refractive index grating corresponding to a light interference pattern of a coherent reference beam and a coherent signal beam, said coherent signal beam is modulated in accordance with the positioning image, and the positioning image and the image data are recorded on different pages.

2. An optical information recording and reproducing apparatus according to claim 1, wherein said medium position adjusting portion is provided with a mechanism for performing parallel motion of said holographic memory in a direction along an optical axis of an optical path of said signal beam from said signal beam generating portion and in two directions perpendicular to the optical axis of the optical path included in a meridional plane and a sagittal plane, respectively, and for performing rotation of said holographic memory around the optical axis of the optical path and said two directions.

* * * * *